US008112166B2

(12) United States Patent
Pavlovic et al.

(10) Patent No.: US 8,112,166 B2
(45) Date of Patent: Feb. 7, 2012

(54) PERSONALIZED SOUND SYSTEM HEARING PROFILE SELECTION PROCESS

(75) Inventors: Caslav V. Pavlovic, Palo Alto, CA (US); Brent W. Edwards, San Francisco, CA (US); Rodney Perkins, Woodside, CA (US); Ephram Cohen, San Francisco, CA (US); Nicholas R. Michael, San Francisco, CA (US)

(73) Assignee: Sound ID, Palo Alto, CA (US)

( * ) Notice: Subject to any disclaimer, the term of this patent is extended or adjusted under 35 U.S.C. 154(b) by 1071 days.

(21) Appl. No.: 11/968,943

(22) Filed: Jan. 3, 2008

(65) Prior Publication Data

US 2008/0165980 A1   Jul. 10, 2008

Related U.S. Application Data

(60) Provisional application No. 60/883,473, filed on Jan. 4, 2007.

(51) Int. Cl.
*G06F 17/00* (2006.01)

(52) U.S. Cl. ........................................................ 700/94

(58) Field of Classification Search .................... 700/94; 381/23.1, 60, 312–333
See application file for complete search history.

(56) References Cited

U.S. PATENT DOCUMENTS

| 6,463,128 | B1 | 10/2002 | Elwin | |
|---|---|---|---|---|
| 6,840,908 | B2 | 1/2005 | Edwards et al. | |
| 6,944,474 | B2 | 9/2005 | Rader et al. | |
| 2004/0141626 | A1* | 7/2004 | Basseas | 381/314 |
| 2008/0167575 | A1* | 7/2008 | Cronin et al. | 600/559 |

FOREIGN PATENT DOCUMENTS

| DE | 10222408 | 11/2003 |
|---|---|---|
| WO | WO-0124576 | 4/2001 |
| WO | WO-0154458 | 7/2001 |
| WO | WO-2004110099 | 12/2004 |

OTHER PUBLICATIONS

Miller, George, A., "The Magical Number Seven, Plus or Minus Two: Some Limits on our Capacity for Processing Information," *The Psychology of Communcication*, Pelican 1970, Chapter 2, 4 pages. ISBN-13: 9780140211412 </search/books/isbn/9780140211412> ISBN: 0140211411 </search/books/isbn/0140211411>.

* cited by examiner

*Primary Examiner* — Andrew C Flanders
(74) *Attorney, Agent, or Firm* — Haynes Beffel & Wolfeld LLP (57) ABSTRACT

A method of generating a personalized sound system hearing profile for a user. The method begins by selecting an initial profile, based on selected factors of user input. In an embodiment, the initial profile is selected based on demographic factors. Then the system identifies one or more alternate profiles, each having a selected relationship with the initial profile. The relationship between alternate profiles and the initial profile can be based on gain as a function of frequency, one alternate profile having a higher sensitivity at given frequencies and the other a lower sensitivity. The next step links at least one audio sample with the initial and alternate profiles and then plays the selected samples for the user. The system then receives identification of the preferred sample from the user; and selects a final profile based on the user's preference. An embodiment offers multiple sound samples in different modes, resulting in the selection of multiple final profiles for the different modes. Finally, the system may apply the final profile to the sound system.

24 Claims, 9 Drawing Sheets

001 # PERSONALIZED SOUND SYSTEM HEARING PROFILE SELECTION PROCESS

RELATED APPLICATION

This application claims the benefit of U.S. Provisional Patent Application No. 60/883,473 entitled PERSONAL SOUND SYSTEM AND HEADSET INCLUDING HEARING PROFILE SELECTION PROCESSES, filed on Jan. 4, 2007. That application is incorporated by reference for all purposes.

BACKGROUND OF THE INVENTION

The claimed invention relates to personalized sound systems, and more particularly to an effective method for generating a personalized hearing profile.

It is widely understood that hearing levels vary widely among individuals, and it is also known that signal processing techniques can condition audio content to fit an individual's hearing response. Individual hearing ability varies across a number of variables, including thresholds of hearing, or hearing sensitivity (differences in hearing based on the pitch, or frequency, of the sound), dynamic response (differences in hearing based on the loudness of the sound, or relative loudness of closely paired sounds), and psychoacoustical factors such as the nature or and context of the sound. Actual injury or impairment, physical or mental, can also affect hearing in a number of ways. The most widely used gauge of hearing ability is a profile showing relative hearing sensitivity as a function of frequency, generally called a hearing profile, discussed in more detail below. Yet, it remains true that the art has not succeeded in providing a system for effectively and rapidly generating individual hearing profiles.

The most widespread employment of individual hearing profiles remains in the hearing aid field, where some degree of hearing impairment makes intervention a necessity. This application entails detailed testing in an audiologist or otologist office, employing sophisticated equipment and highly trained technicians. The result is an individually-tailored hearing aid, utilizing multiband compression to deliver audio content exactly matched to the user's hearing response. It will be understood that this process is expensive, time-consuming and cumbersome, and it plainly is not suitable for mass personalization efforts.

The rise of the Internet has offered the possibility for the development of personalization techniques that flow from on-line testing. Efforts in that direction have sought to generate user hearing profiles by presenting the user with a questionnaire, often running to 20 questions or more, and using the user input to build a hearing profile. Such tests have encountered problems in two areas, however. First, user input to such questionnaires has proved unreliable. Asked about their age alone, without asking for personal information, for example, users tend to be less than completely truthful. To the extent such tests can be psychologically constructed to filter out such bias, the test becomes complex and cumbersome, to that users simply do not finish the test.

Another testing regime is set out in U.S. Pat. No. 6,840,908, entitled "SYSTEM AND METHOD FOR REMOTELY ADMINISTERED, INTERACTIVE HEARING TESTS," issued to Edwards and others on 11 Jan. 2005, and owned by the assignee of the present application. That patent presents a number of techniques for such testing, most particularly a technique called "N-Alternative Forced Choice," in which a user is offered a number of audio choices among which to select one that sounds best to her. Also known as "sound flavors," based on the notion of presenting sound and asking the user which one is preferred, this method can lack sufficient detail to enable the analyst to build a profile.

In sum, at least three different forms of test procedure have been employed by the art, without arriving at a method that produces accurate results in a way that makes mass deployment possible.

The ultimate goal of personalization efforts is the delivery of personalized audio content. That goal actually encompasses a number of distinct products and processes. For example, one facet of this effort aims at offering devices that deliver personalized audio signals to a user. U.S. Pat. No. 6,944,474, issued to Rader and others, describes a mobile phone with audio processing functionality that can be adapted to the hearing profile of the user. In another example, International Publication No. WO 01/24576 A1, entitled PRODUCING AND STORING HEARING PROFILES AND CUSTOMIZED AUDIO DATA BASED (sic), by Pluvinage, describes a variety of applications of hearing profile data. Among the specific applications mentioned there is downloading audio content, such as MP3 music files, which have been conditioned to match a user profile already on file with the provider.

The prior art has focused on coupling hearing aids using wireless networks to other devices, for the purpose of programming the hearing aid and for coupling the hearing aid with sources of sound other than the ambient environment. See, for example, International Publication No. WO 2004/110099 A2, entitled HEARING AID WIRELESS NETWORK, by Larsen et al.; International Publication No. WO 01/54458 A2, entitled HEARING AID SYSTEMS, by Eaton et al.; German Laid-open Specification DE 102 22 408 A 1, entitled INTEGRATION OF HEARING SYSTEMS INTO HOUSEHOLD TECHNOLOGY PLATFORMS by Dageforde. In Larsen et al. and Dageforde, for example, the idea is described of coupling a hearing aid by wireless network to a number of sources of sound, such as door bells, mobile phones, televisions, various other household appliances and audio broadcast systems. Co-pending and co-owned U.S. Application PERSONAL SOUND SYSTEM INCLUDING MULTI-MODE EAR LEVEL MODULE WITH PRIORITY LOGIC; application Ser. No. 11/569,499, filed 21 Nov. 2006, by Cohen et al. (Publication No. US-2007-0255435-A1) describes implementation of user customizable ear modules for use in a variety of settings, including the ability to process audio using hearing profiles of the users.

A drawback of many products offered to date has been the significant data processing workload required at each audio source to support participation in the network. There remains a need for techniques to reduce these data processing requirements.

SUMMARY

There is presented a method of generating a personalized sound system hearing profile for a user. The method begins by selecting an initial profile, based on selected factors of user input. In an embodiment, the initial profile is selected based on demographic factors. Then the system identifies one or more alternate profiles, each having a selected relationship with the initial profile. For example, a hearing profile can be characterized by a set of coefficients for a multiband compression algorithm, and the relationship between alternate profiles and the initial profile can be based on amplitudes of the coefficients. For example, one alternate profile includes a set of coefficients having greater magnitude, on average or across the board, than the corresponding coefficients for the initial profile and the other alternate profile includes a set of coefficients having lesser magnitude, on average or across the board, than the corresponding coefficients for the initial profile The next step links at least one audio sample with the initial and alternate profiles and then plays the selected samples for the user. The system then receives identification of the preferred sample from the user; and selects a final profile based on the user's preference. An embodiment offers multiple sound samples in different modes, resulting in the selection of multiple final profiles for the different modes. Finally, the system may apply the final profile to the sound system.

There is also presented a system for generating a personalized sound system hearing profile for a user. The system includes means for selecting an initial profile, based on selected factors of user input. In an embodiment, the initial profile is selected based on demographic factors. Then the system identifies one or more alternate profiles, each having a selected relationship with the initial profile. The relationship between alternate profiles and the initial profile can be based on gain as a function of frequency, one alternate profile having a higher sensitivity at given frequencies and the other a lower sensitivity. The system then links at least one audio sample with the initial and alternate profiles and then plays the selected samples for the user. The system next receives identification of the preferred sample from the user; and selects a final profile based on the user's preference. An embodiment offers multiple sound samples in different modes, resulting in the selection of multiple final profiles for the different modes. Finally, the system may apply the final profile to the sound system.

DETAILED DESCRIPTION

A detailed description of embodiments of the present invention is provided with reference to the FIGS. 1-7.

Figure 1A:
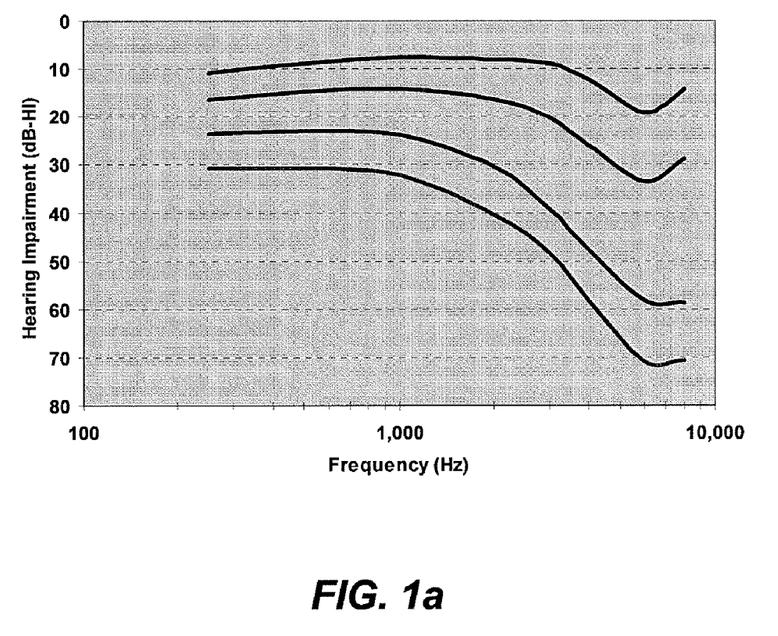
FIGS. 1a and 1b contain hearing impairment curves based, respectively, on age and gender.
Figure 1B:
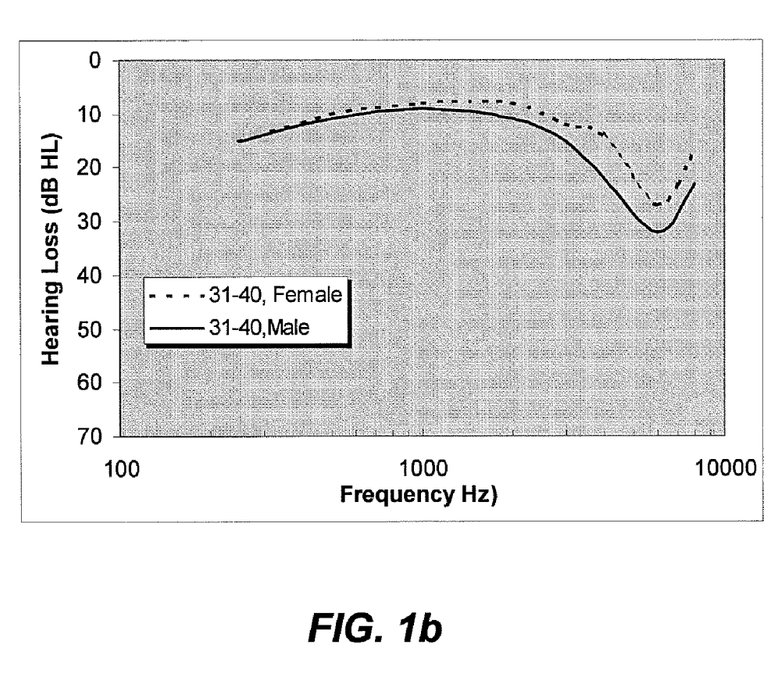

As is generally known, hearing varies among individuals. Generally, the most important measure of hearing is threshold of hearing, or hearing sensitivity, which measures hearing acuity as a function of frequency, or pitch, as shown in the charts of FIGS. 1a and 1b. Hearing profiles vary considerably among individuals, both as a generally characteristic and as the result of injury, or exposure to high level sounds of particular pitch, such as the loud high-frequency noise associated with jet aircraft engines. Profiles vary over time for individuals as well, as seen in the curves of FIG. 1a. as can be seen there, high frequency hearing drops of markedly as a person ages. Additionally, a general divergence in hearing ability between the genders has been noted, as shown in FIG. 1b.

Despite the known diversity in hearing abilities, providers of audio content have continued to supply products tailored to a single, mythical "standard" hearing sensitivity curve. Those of skill in the art, however, understand that the ability to modify audio signals to compensate for individual differences has existed for some time in the hearing aid industry. That art once was limited simply to boosting the volume of audio input to an individual's ear, but modern devices apply multiband compression algorithms to modify signals in discrete frequency bands. That technology offers the ability to achieve a desired profile, tailored to an individual's hearing needs. The problem remains one of devising a test method suitable for use by a mass audience, which also produces sufficiently detailed and accurate profile information.

Figure 2A:
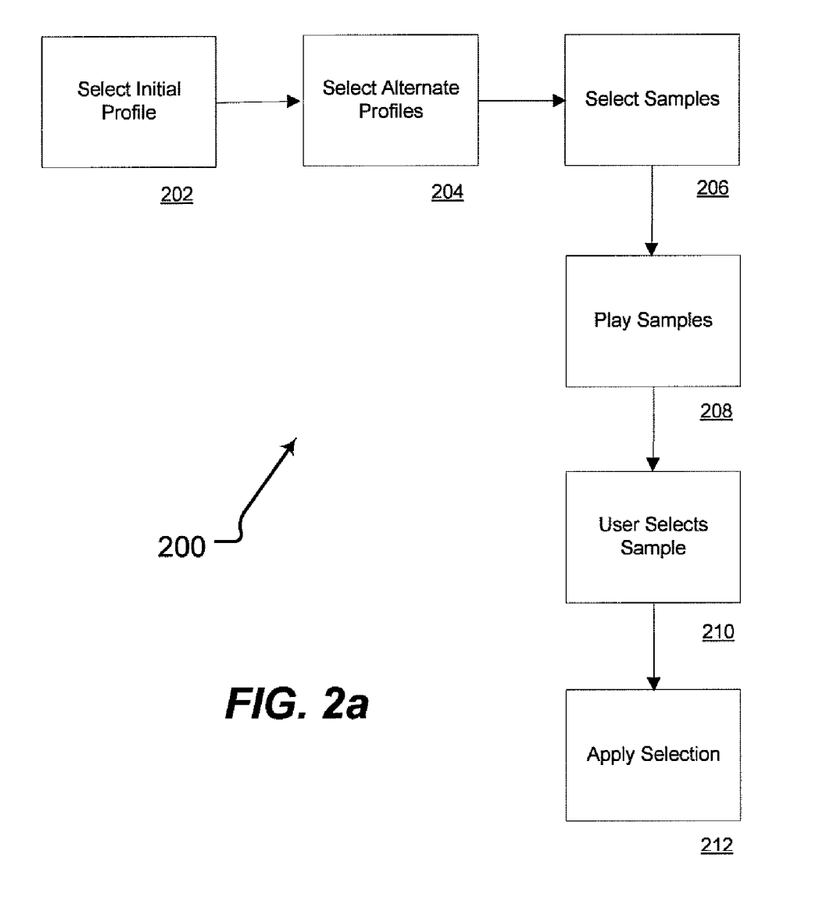
FIG. 2a depicts an embodiment of a process according to the claimed invention.

An embodiment of a process 200 for solving that problem is shown in FIG. 2a. As depicted there, the process lends itself to implementation in a wide variety of contexts and formats. Therefore, the generally functionality and overview of the system will be discussed first, followed by a more detailed exploration that includes possible implementation details.

In broad terms, the process selects a suitable individual profile by first selecting an optimum start point for evaluation, then further selecting suitable alternate choices, presenting the choices to the user, accepting the user's choice, and then implementing that choice in a variety of ways. That description covers a considerable array of alternatives, with some representative choices set out below.

This profile can be implemented in a number of ways, and those in the art will appreciate that a variety of choices, in both hardware and software, are suitable to particular situations. One set of embodiments that call for the process to be set out in software, operable either in a pure client mode (that it, the software is contained on a storage medium, such as a disk, and is loaded and run on a single computer, such as the widely used PC). Alternatively, the system could be run in client-server mode, in which a portion of the system resides on a client (user) computer and the remainder runs on a server, such as a web server, accessible via the world-wide web on the Internet. Another alternative is a completely web-based system, in which all functionality resides on a web server. As a further alternative, the software operating the claimed system could be wholly embedded in an operating audio device, such as a mobile phone, headset or earpiece, which could interact with a client computer as required for interface purposes (GUI, keyboard, etc.). Such interaction could be via cable or wireless communication link.

Figure 2B:
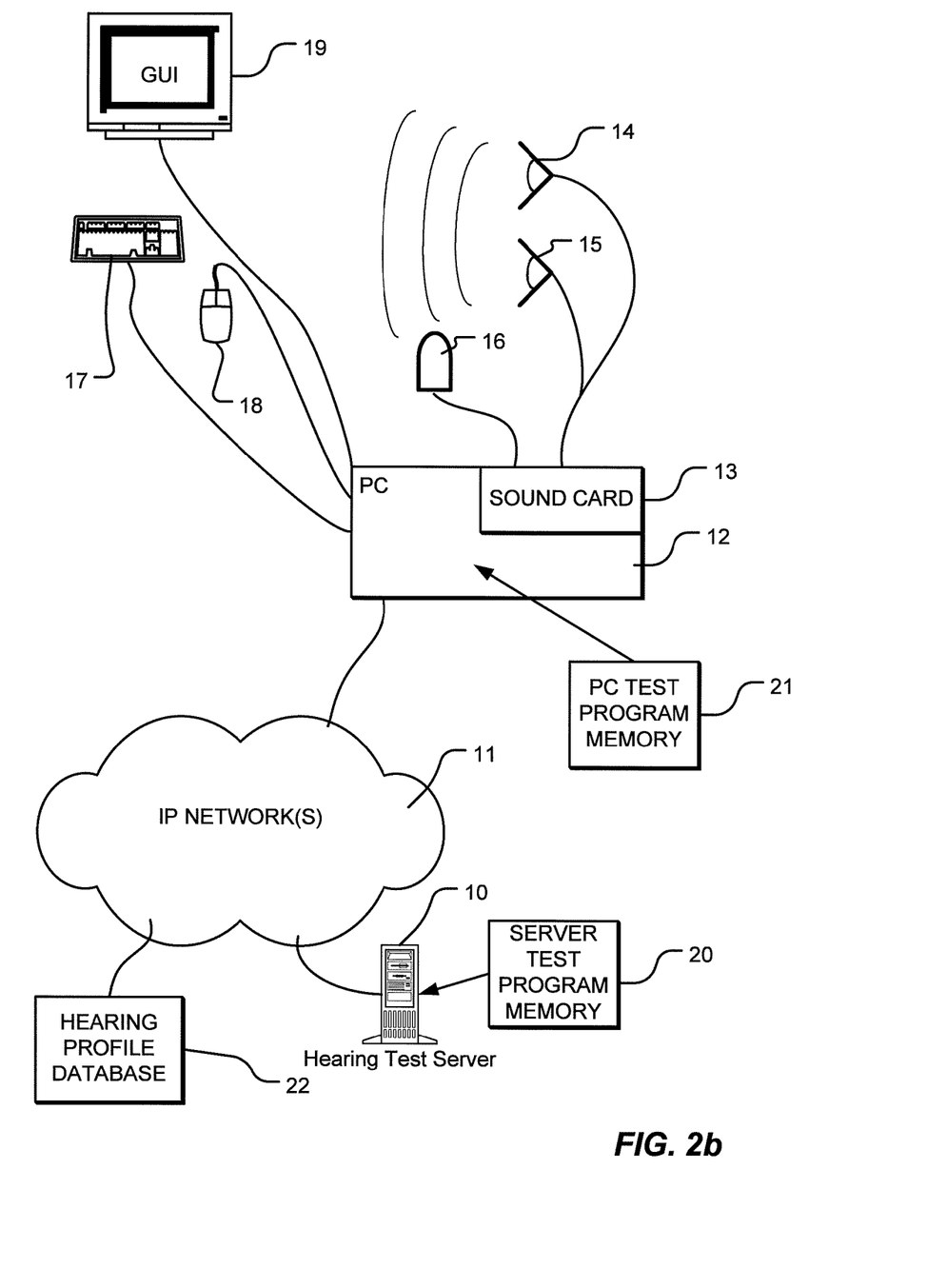
FIGS. 2b and 2c depict embodiments of systems according to the claimed invention.
Figure 2C:
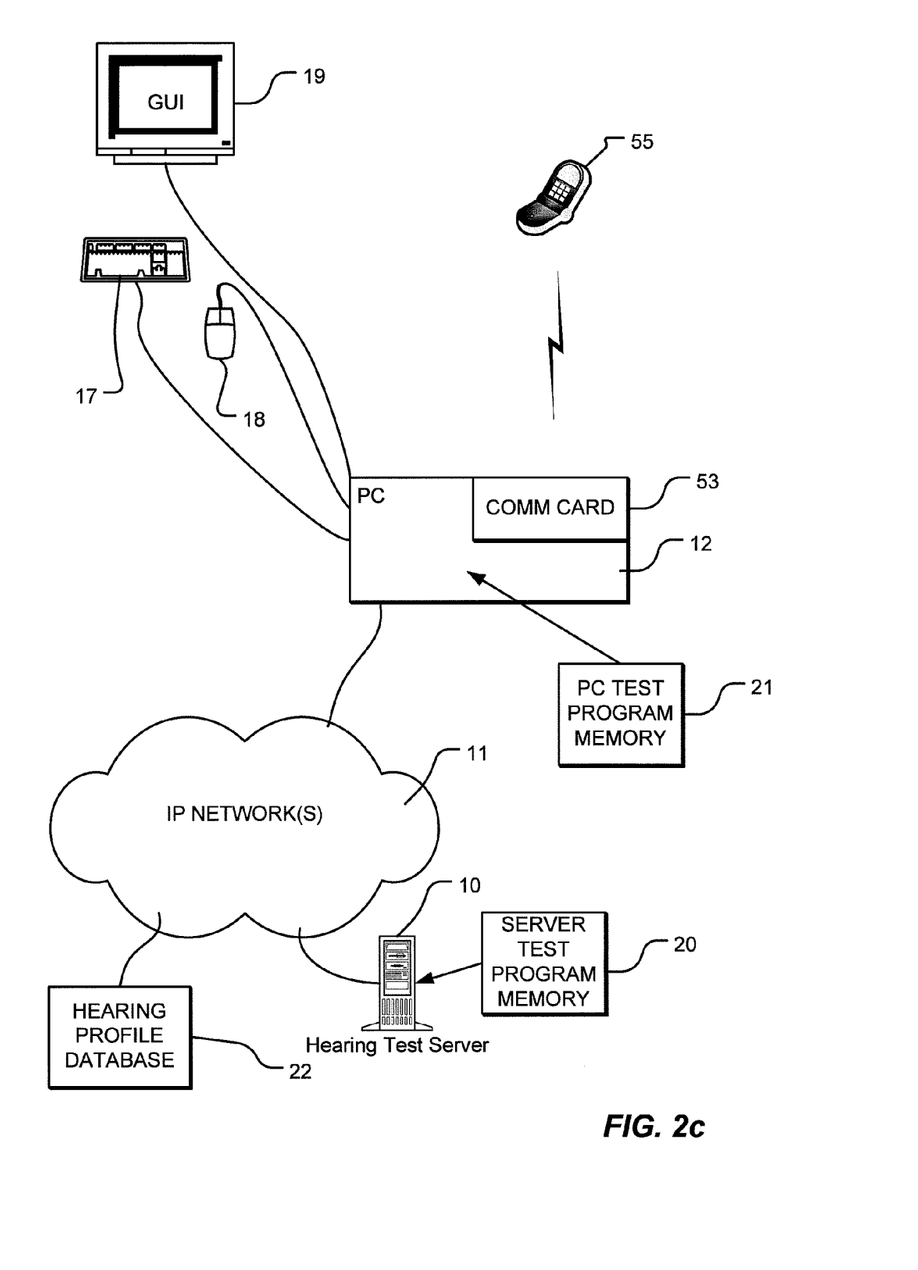

FIG. 2b illustrates a client-server architecture of a system useful for performing the process 200. The system includes a hearing test server 10 coupled to a communication network 11, such as the Internet. The hearing test server 10 executes an interactive, hearing test protocol, as set out by steps 202, 204, 206 and 208. That protocol is embodied in machine-readable code carried on a readable storage medium, such as CD-ROM or DVD, or on a hard disk resident at the server 10. A user end station 12, such as a personal computer, is also coupled to the communication network 11. The end station 12 includes a sound card 13 which provides data processing resources for producing audio output and receiving audio input under control of the logic in computer programs executed by the processor in the end station 12. In the figure, the sound card 13 is connected to stereo speakers 14 and 15, or to a headphone, and to a microphone 16. However, a wide variety of configurations exist in the end stations, which are not in the control of the hearing test server. The end station 12 also typically includes a display 19, a keyboard 17, and a mouse 18. During the test, audio stimuli in the form of sound signals produced in the sound card 13 are generated using the stereo speakers 14 and 15 in this example. The sound signals may be sampled or computed sound. Environmental factors such as background noise, and the level of the output of the speakers 14 and 15 could be sensed using a microphone 16. The display 19 is used to display a graphical user interface which prompts a user to input data using the keyboard 17 or the mouse 18 in response to the audio stimuli of the test.

Alternatively, the test can be carried out using the final device in which the profile is to be implemented. The embodiment of FIG. 2c, for example, shows a cell phone 55, in communication with a communications card 53 in the user PC. The communication link can be an appropriate cable, a wireless link via the telephone system or a separate link built into the phone, or other system hereafter developed. Here, rather than testing the user's response to profiles reproduced on speakers, a response which could differ from that achieved on the actual device, such as a cell phone, the device itself is brought into the test procedure. Further implementation details for this embodiment will be clear to those of skill in the art.

The first portion of the process 200 is executed using a computer program that includes a first component stored on the server test program memory 20, which is connected to the server 10. A second program component is stored in the PC test program memory 21 which is connected to the end station 12. As discussed in more detail below, a hearing profile is produced for the user at the completion of a test cycle. In a one embodiment, this hearing profile is stored in a hearing profile database 22, which is accessible using Internet 11. In another embodiment, the hearing profile database 22 is coupled directly to the server 10. Alternatively, the hearing profile might be stored only on users end station and not made available to the communication network.

In this example, the end station 12 consists of a personal computer with standard sound card components. In other embodiments, the end station consists of a mobile phone, a personal digital assistant, or other consumer electronic device, such as home stereo or television equipment having the capability to communicate with a remote test server.

In one implementation, the hearing test server 10 maintains a web site. To initiate a hearing test, a user at the end station 12 accesses the web site and downloads a component (e.g. a web page with or without active code, a .wav file that encodes an audio stimulus, or other software component) of the hearing test computer program from the server 10 for execution at the end station 12. The user initiates the test without intervention by a third party, and uses the resources available via the Internet and the resources at the end station to conduct a hearing test.

In similar fashion, as known to those in the art, the claimed invention can be implemented in pure server model or pure client models. While operational details would differ in each instance, the functionality of the process would remain the same. Primarily, each model would suffice to turn out operable hearing profiles.

Ultimately, the system claimed below provides hearing profiles that condition audio content delivered to a user. One manner of such operation is operation within audio delivery devices, such as headsets, earpieces, speakers and the like. Here, each device contains audio processing means, which accept a "standard" audio signal as input and output a signal modified according to a user profile. Audio playback devices such as music players, radio receivers, and the like function similarly, taking signals from a storage device, such as a music disk, or from broadcast radio or TV sources. A separate delivery means is accomplished by content providers, who obtain a profile from a user and then deliver personalized content to a user, so that, for example, a piece of music downloaded from a participating site has already been conditioned, based upon the user's individual needs. These and many other applications are possible, all within the ambit of the claims set out below. Those in the art can adapt the description below to any of these environments or contexts with no further technical discussion required.

Turning back to FIG. 2, the first step, selecting the starting profile, step 202, turns out to be critical for achieving any efficiency or computational speed. As those in the art will appreciate, a vast number of profiles present themselves as possible starting points, from which the user will home in on a profile that provides the best match to her hearing response. As taught in the prior art references cited above, approaches to that problem have generally sought to identify factors that might affect a user's hearing, such as environmental factors. Alternatively, the N-Alternative Forced Choice method seeks its result by offering a series of sound choices.

All of the embodiments set out above suffer from the amount of user participation required. A surprising finding by the inventors herein is that by selecting a few key demographic data, one can come very close to an optimum result. In the embodiment shown here, the selected data are the gender and age of the user. In studying hearing issues with representative populations, it has been found that using these two data produces results sufficiently accurate for highly usable profiles.

Figure 3:
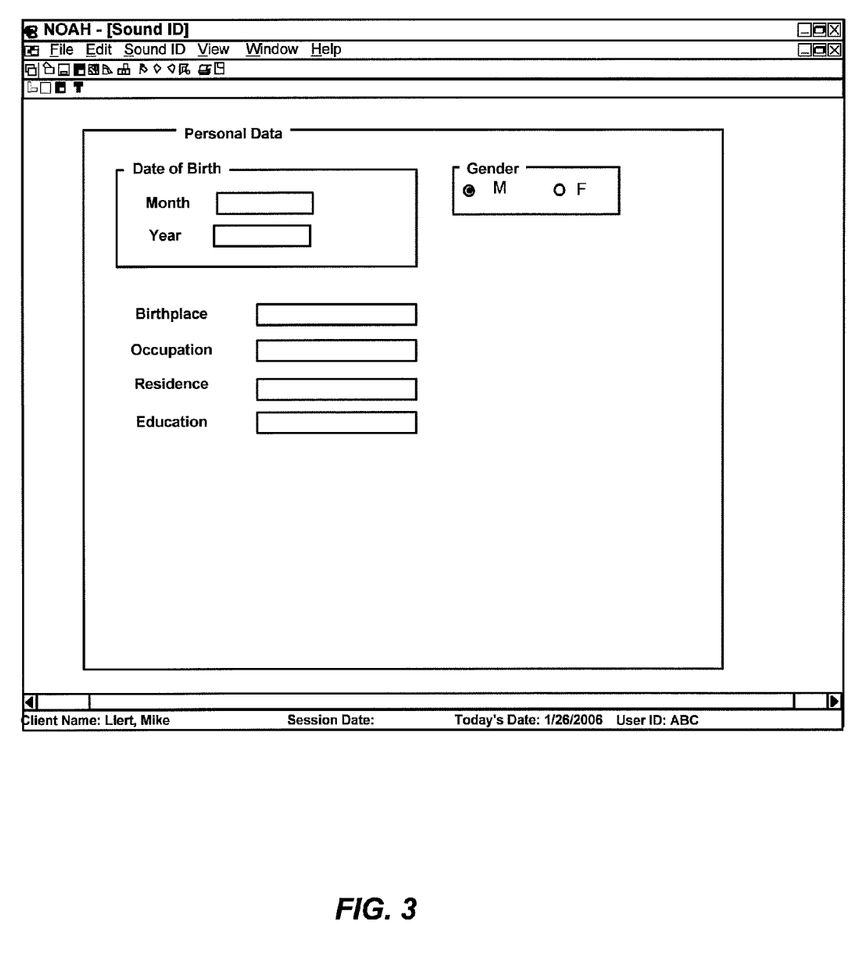
FIG. 3 illustrates a computer graphic user interface screen displayed during execution of the process shown in FIG. 2.

A screen shot of a method for capturing age and gender information is shown in FIG. 3, in the form of a graphical user interface screen dialog box. It should be noted that the only information needed by the system is age and gender. It has been found, however, that users do not respond accurately to short, simple questions. Offered several questions, however, the accuracy of responses goes up. The need is to pick a list short enough to avoid confusing or boring the user, yet long enough to elicit truthful responses. As noted in the figure, the user is prompted for input by presenting a set of questions via the computer GUI. As known in the art, a number of techniques can be used for user input, such as the textboxes seen in the drawing here, or radio buttons, pick lists and the like. The key points are that the user is prompted for input and that input is received when the user enters it.

However the data are collected and processed, the result is the selection of a set of data sufficient to allow the generation of selection of a hearing modification profile. In one embodiment, an algorithm is derived from basic principles that allow calculation of a profile. That result requires considerable computation overhead, however. Another embodiment employs a database containing a set of profiles, indexed by age and gender. An example of such a database is the database 400 seen in FIG. 4. The database consists of a number of records 402, shown as Rec 1, Rec 2 . . . Rec n. Each record contains a record ID, an age, a gender, a profile records, and Offset Up and Offset Down records, explained below. The database can be implemented using any of the standard commercially available relational database products, such as those available from Oracle Corp. or Microsoft Corp.

Data for the profiles contained in the database records can best be gathered empirically, either from existing test data or from newly collected test data, as desired by the user. Here, empirical data is highly preferable, as those in the art understand how to describe the hearing profile with good accuracy.

Although one could achieve minimally acceptable results with a database having relatively few entries, the cost in all respects of maintaining a larger database is highly reasonable, offering highly granular results. Relational database techniques allow very fast access, and the relatively small size of the data records allows fast retrieval. Thus, while a database having tens of entries might produce minimally acceptable results, it will be relatively straightforward to build a database of hundreds or thousands of records, providing more accurate and detailed results.

Figure 5:
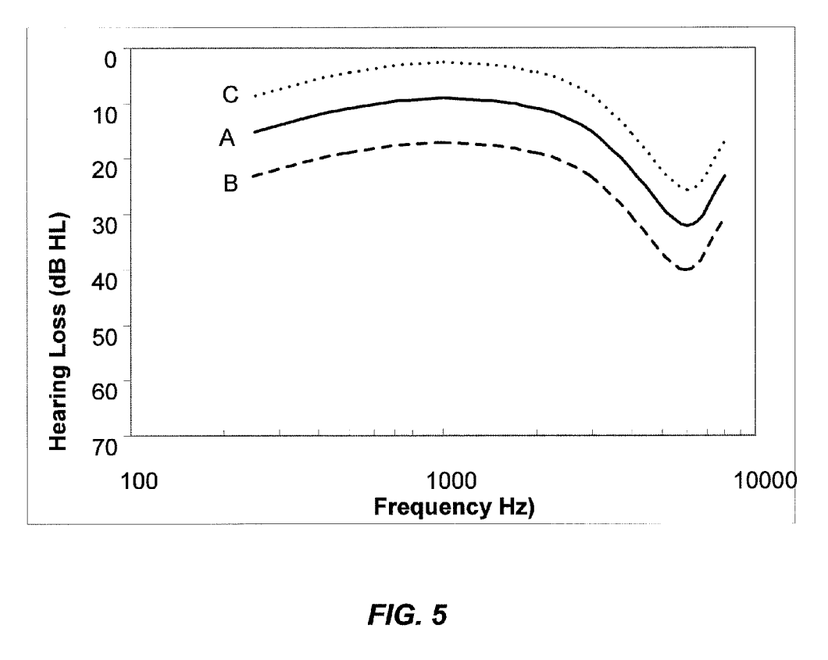
FIG. 5 contains hearing profiles employed during execution of the process shown in FIG. 2.
Figure 6:
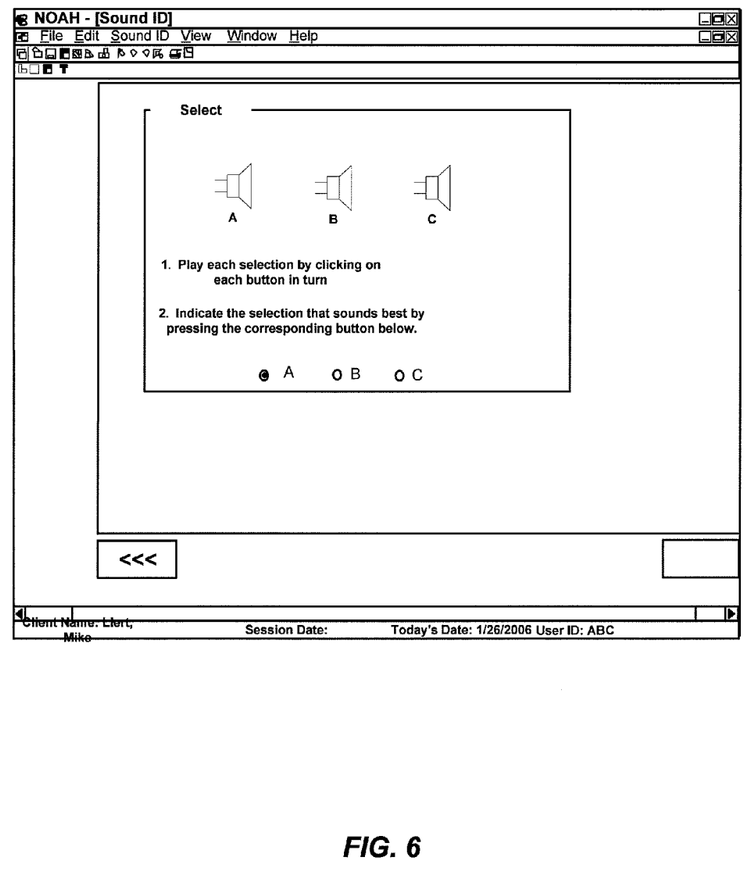
FIG. 6 illustrates a further computer graphic user interface screen displayed during execution of the process shown in FIG. 2.

Having a starting profile, a set of alternate profiles is generated in step 204. The object of the exercise is to present the user with a set of choices that differ sufficiently to present a choice, yet are sufficiently close to stay within the same hearing area. A method for accomplishing that result is to start with the selected profile and then select a profile higher than the selected profile and another below it. Experience in the field suffices to provide a basis for selecting the separation between profiles. A resulting set of profiles is shown in FIG. 5, where profile A is the profile selected as the starting point, and profiles B and C are the surrounding profiles.

Figure 4:
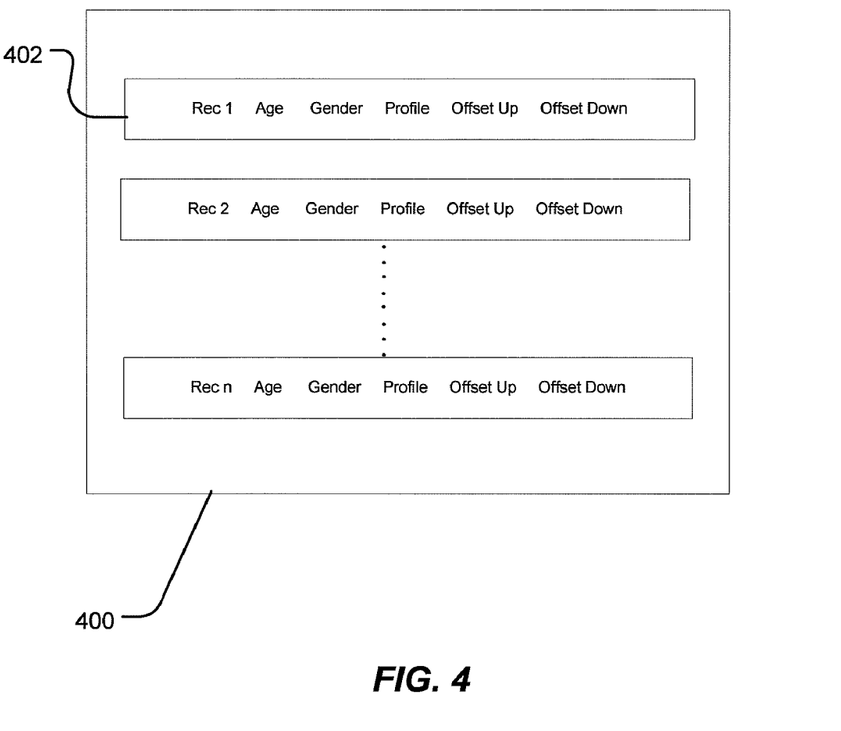
FIG. 4 illustrates the architecture of a database employed in an embodiment of the system of FIG. 2b.

The alternate profiles are indicated in the database record 402 for the primary profile, in the data items Offset Up and Offset Down, which contain the Record IDs of the upper and lower alternate profiles associated with a given primary profile. Those profiles can be retrieved very rapidly.

Then, the set of profiles is linked with a sound sample to be played for the user, employing each of the profiles. The sample can be any audio content, but better results will be achieved if the content is chosen to simulate the sort of content that the user is most likely to hear. For example, if the primary application will be on cellular phones, then the sample should be chosen to reflect speech. Music player applications would feature music, and so on. Also, the samples should be amenable to hearing tonal differences, so the user can clearly distinguish such differences. In each instance, application of basic principles to the facts of the situation will allow a practitioner to arrive at a workable solution rapidly.

In the illustrated embodiment, samples are offered for a number of different audio content modes. A minimal embodiment offers only two modes, speech and music. A music mode requires different psychoacoustic processing than does the speech mode, allowing for different hearing profiles to be created for each mode. Alternative modes to the basic speech and music modes described are based on the type of device being programmed and the type of audio source being processed, including cell phone mode, companion module mode, office phone mode, home phone mode, music from cell phone mode, music from dedicated music player mode, music from television mode, etc. During testing for each mode, the user selects among three hearing profiles. In the illustrated embodiment the user listens to audio samples played on her own computer, via the Internet. In alternative embodiments, audio samples could be transmitted via a communication channel to an ear module and played by the audio processors on the ear module. In any of the embodiments, the user selects the sample that sounds best.

FIG. 5 illustrates a screen in a graphical user interface such that the user can compare simulated audio for the speech and music modes of operation in different environments with and without the selected hearing profiles, so that the user can understand how applying the hearing profile to the ear module will affect its operation Turning again to process 200, the samples are presented to the user, step 208, and the user plays them to determine which is preferable. A method for accomplishing that result is shown in FIG. 5, in which the samples are linked to pushbuttons, allowing the user to play selections as often as needed, using the mouse or other input device. When ready, the user can indicate her choice with the appropriate radio button, step 210.

At that point the system is prepared to apply the selected profile to the application, step 212 of process 200. Given the nature of the application, a person of skill in the art can implement an appropriate means for transmitting the selected profile to the device being used, as discussed above, and for integrating the profile into the device itself. The Rader and Pluvinage documents, referred to above, provide examples of such processes. For example, a data channel can be opened between the device and a computer, either via a cable or wireless connection, and the device's operating software can oversee the data transfer and integration.

In an alternative embodiment, the system selects and applies not only the user's preferred profile but several others to the user device. The profile selected by the user is selected, and others can be chosen in a cluster around that profile. One embodiment provides two additional profiles, but more are used in other embodiments. Here, the user can be offered a choice, allowing her to toggle between a number of profiles. Such a choice will provide the user the ability to compensate somewhat for environmental changes, such as increased noise or the like, that affects the user's perception or hearing sensitivity.

Figure 7:
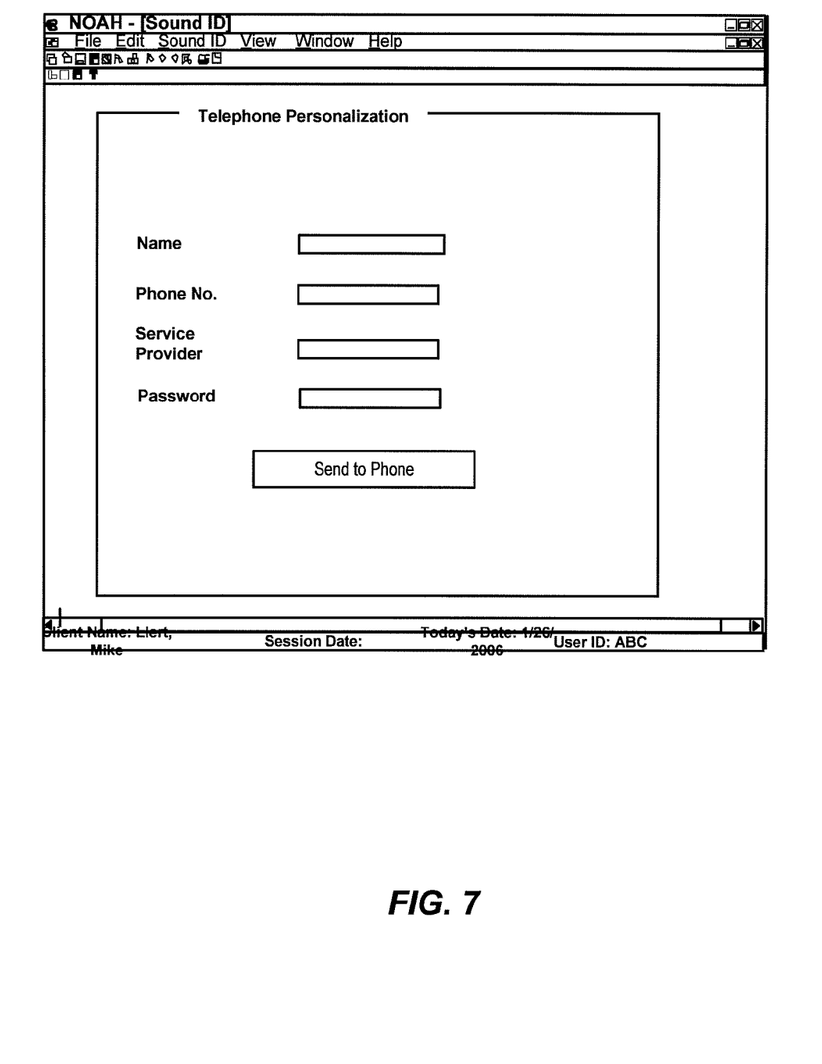
FIG. 7 illustrates another computer graphic user interface screen displayed during execution of the process shown in FIG. 2.

FIG. 7 illustrates a screen in a graphical user interface that allows the user to enter information necessary to link to a mobile phone by a configuration link across a public switched telephone network, to program one or more hearing profiles. In the illustrated embodiment the selected hearing profiles are transferred to a mobile phone.

In alternative embodiments the hearing profiles are transferred in data formats used by an ear module to an ear module using a process like that described above, or other processes using wired or wireless links as known in the art. For example, a data format like "presets" adapted for use by a processor on the ear module as described in co-owned and co-pending U.S. patent application Ser. No. 11/569,499, referred to above and which is incorporated by reference as if fully set forth herein, can be used for delivery of the selected hearing profile.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention.

We claim:

1. A method of generating a personalized hearing profile for a user, comprising:
    selecting a reference hearing profile and one or more alternate hearing profiles from a source of hearing profiles matched with demographic profiles, based on input of personal demographic data about a user;
    playing reference and alternate versions of an audio sample, the reference version being played according to the reference hearing profile and the alternate version or versions being played according to the alternate hearing profile or profiles;
    receiving identification of a preferred one of the reference and alternate versions from the user; and
    selecting a personalized hearing profile for the user based on the identification.

2. The method of claim 1, further including the step of applying the personalized profile to a sound system.

3. The method of claim 1, wherein the personal demographic data includes age and gender of the user.

4. The method of claim 1, wherein two or more alternate profiles are selected, and two or more alternate versions are played.

5. The method of claim 1, including:
prompting user input of the demographic data by a computer screen display on a computer graphic user input system; and
receiving user input.

6. The method of claim 1, wherein the source of hearing profiles matched with demographic profiles comprises a profile algorithm.

7. The method of claim 1, wherein the source of hearing profiles matched with demographic profiles comprises a plurality of stored profiles.

8. The method of claim 1, wherein two alternate profiles are selected, one at a generally higher sensitivity at given frequencies and the other a lower sensitivity than the initial profile.

9. The method of claim 1, including playing reference and alternate versions of multiple audio samples, each of the multiple audio sample presenting a different mode of sound.

10. The method of claim 9, wherein the sound modes include at least music and speech.

11. The method of claim 1, including selecting a plurality of personalized hearing profiles.

12. The method of claim 1, wherein the playing step occurs on a computer.

13. The method of claim 1, wherein the playing step occurs on a personalized sound system.

14. A system for providing a personalized hearing profile, comprising:
a computer configured to present a user interface prompting input of personal demographic data about a user, and to select a reference hearing profile and one or more alternate hearing profiles from a source of hearing profiles matched with demographic profiles, based on input of personal demographic data about the user;
to present a user interface prompting selection of reference and alternate versions of an audio sample, and to play the reference and alternate versions in response to the selection, the reference version being played according to the reference hearing profile and the alternate version or versions being played according to the alternate hearing profile or profiles; and
to present a user interface prompting identification of a preferred one of the reference and alternate versions, and in response to the identification to select a personalized hearing profile for the user and apply the personalized hearing profile to a sound system.

15. The system of claim 14, wherein the computer is configured to present the user interfaces in a client-server architecture.

16. The system of claim 14, wherein the computer is configured to present the user interfaces over a network.

17. The system of claim 14, wherein the computer is embedded in a personalized sound system.

18. The system of claim 14, wherein the personal demographic data includes initial selection factors are the age and gender of the user.

19. The system of claim 14, wherein two alternate hearing profiles are selected.

20. The system of claim 14, wherein the source of hearing profiles matched with demographic profiles comprises on a profile algorithm.

21. The system of claim 14, wherein the source of hearing profiles matched with demographic profiles comprises a plurality of stored profiles.

22. The system of claim 14, wherein two alternate hearing profiles are selected, one at a generally higher sensitivity at given frequencies and the other at a lower sensitivity than the initial profile.

23. The system of claim 14, wherein the computer is configured to prompt selection of reference and alternate versions of multiple audio samples, each of the multiple audio samples sample presenting a different mode of sound.

24. The method of claim 14, wherein the sound modes include at least music and speech.

* * * * *